(12) United States Patent
Rajagopalan et al.

(10) Patent No.: US 12,305,273 B2
(45) Date of Patent: May 20, 2025

(54) NANOTWINNED NICKEL FILMS WITH HIGH STRENGTH AND DUCTILITY

(71) Applicants: Jagannathan Rajagopalan, Tempe, AZ (US); Rohit Berlia, Tempe, AZ (US)

(72) Inventors: Jagannathan Rajagopalan, Tempe, AZ (US); Rohit Berlia, Tempe, AZ (US)

(73) Assignee: ARIZONA BOARD OF REGENTS ON BEHALF OF ARIZONA STATE UNIVERSITY, Scottsdale, AZ (US)

( * ) Notice: Subject to any disclaimer, the term of this patent is extended or adjusted under 35 U.S.C. 154(b) by 5 days.

(21) Appl. No.: 18/350,138

(22) Filed: Jul. 11, 2023

(65) Prior Publication Data

US 2024/0018643 A1    Jan. 18, 2024

Related U.S. Application Data

(60) Provisional application No. 63/389,649, filed on Jul. 15, 2022.

(51) Int. Cl.
| | | |
|---|---|---|
| *C23C 14/18* | (2006.01) | |
| *C23C 14/02* | (2006.01) | |
| *C23C 14/35* | (2006.01) | |
| *C23C 14/54* | (2006.01) | |

(52) U.S. Cl.
CPC ............ *C23C 14/18* (2013.01); *C23C 14/021* (2013.01); *C23C 14/025* (2013.01); *C23C 14/35* (2013.01); *C23C 14/542* (2013.01)

(58) Field of Classification Search
CPC ..... C23C 14/18; C23C 14/021; C23C 14/025; C23C 14/35; C23C 14/542
USPC .......................................... 204/192.12, 192.15
See application file for complete search history.

(56) References Cited

U.S. PATENT DOCUMENTS

| | | | |
|---|---|---|---|
| 8,138,064 B2* | 3/2012 | Akiyama | .......... H01L 21/76256 257/E21.32 |
| 2015/0233019 A1* | 8/2015 | Zhang | .................. C23C 14/165 428/612 |
| 2015/0275350 A1* | 10/2015 | Ott | ........................ C23C 14/541 204/192.15 |

OTHER PUBLICATIONS

Yu et al. "Basic criteria for formation of growth twins in high stacking fault energy metals", Applied Physics Letters, 103, 181903-1-5 (2013) (Year: 2013).*
Berlia, R. et al. High strength and ductility in a heterostructured nanotwinned Ni film. Scripta Materialia. 213, 1-6. 2022.
Ledermann, N. et al. {1 0 0}-Textured, piezoelectric Pb(Zrx, Ti1-x)O3 thin films for MEMS: integration, deposition and properties. Sens. Actuators A Phys. 105, 162-170. 2003.
Wang, P. et al. The Evolution of Flexible Electronics: From Nature, Beyond Nature, and to Nature. Adv. Sci. 7. 2020.

(Continued)

*Primary Examiner* — Rodney G McDonald
(74) *Attorney, Agent, or Firm* — Snell & Wilmer L.L.P.

(57) ABSTRACT

Synthesis of high SFE nanotwinned metallic films with varying distributions of twin widths on a low SFE metallic layer using magnetron sputtering is disclosed. In various embodiments, a method for forming a nanotwinned metal film may include providing a single crystal silicon wafer, etching the single crystal silicon wafer, depositing a silver film onto the single crystal silicon wafer forming a silver buffer layer, and depositing a metallic film onto the silver buffer layer using sputtering at a controlled temperature.

9 Claims, 20 Drawing Sheets

(56) References Cited

OTHER PUBLICATIONS

Han, X.. et al. Printable high-speed thin-film transistor on flexible substrate using carbon nanotube solution. The Institution of Engineering and Technology 2007. doi 10.1049/mnl:20070033.
Lima, A.L. et al. Length scale effects on the electronic transport properties of nanometric Cu/Nb multilayers. Thin Solid Films. 515. 3574-3579. 2007.
Dong, L. et al. Thermal Conductivity, Electrical Resistivity, and Microstructure of Cu/W Multilayered Nanofilms. ACS Appl. Mater. Interfaces. 12. 8886-8896. 2020.
Gianola, D.S. et al. Stress-assisted discontinuous grain growth and its effect on the deformation behavior of nanocrystalline aluminum thin films. Acta Materialia. 54. 2253-2263. 2006.
Berlia, R. et al. Tensile behavior and inelastic strain recovery of Cu—Co nanolaminates. Scripta Materialia. 197. 2021.
Beyerlein, I. J. et al. Growth Twins and Deformation Twins in Metals. Annu. Rev. Mater. Res. 44. 329-363. 2014.
Cheng, Z. et al. Extra strengthening and work hardening in gradient nanotwinned metals. Science. 362. 2018.
Zhao, S. et al. Cryoforged nanotwinned titanium with ultrahigh strength and ductility. Science. 373. 1363-1368. 2021.
Lu, L. et al. Fatigue and fracture of nanostructured metals and alloys. MRS Bulletin. 46. 258-264. 2021.
Lu, L. et al. Ultrahigh Strength and High Electrical Conductivity in Copper. Science. 304. 422-426. 2004.
Anderoglu, O. et al. Thermal stability of sputtered Cu films with nanoscale growth twins. Appl. Phys. Lett. 93. 2008.
Hodge, A.M. et al. Twin stability in highly nanotwinned Cu under compression, torsion and tension. Scripta Materialia. 66. 872-877. 2012.
Niu, R. et al. Strain hardening and softening in nanotwinned Cu. Scripta Materialia. 68. 960-963. 2013.
Anderoglu, O. et al. Plastic flow stability of nanotwinned Cu foils. International Journal of Plasticity. 26. 875-886. 2010.
Kobler, A. et al. Nanotwinned silver nanowires: Structure and mechanical properties. Acta Materialia. 92. 299-308. 2015.
Furnish, T.A. et al. On the mechanical performance and deformation of nanotwinned Ag. APL Mater. 2. 2014.
Lu, K. et al. Strengthening Materials by Engineering Coherent Internal Boundaries at the Nanoscale. Science. 324. 349-352. 2009.
Bufford, D.C. et al. Synthesis and microstructure of electrodeposited and sputtered nanotwinned face-centered-cubic metals. MRS Bulletin. 41. 286-291. 2016.
Lu, L. et al. Revealing the Maximum Strength in Nanotwinned Copper. Science. 323. 607-610. 2009.
Xue, S. et al. High strength, deformable nanotwinned Al—Co alloys. Materials Research Letters. 7. 33-39. 2019.
Shang, S.L. et al. Effects of alloying element and temperature on the stacking fault energies of dilute Ni-base superalloys. Journal of Physics: Condensed Matter. 24. 2012.
Duan, F. et al. Ultrastrong nanotwinned pure nickel with extremely fine twin thickness. Sci. Adv. 7. 2021.
Sim, G.D. et al. Nanotwinned metal MEMS films with unprecedented strength and stability. Sci. Adv. 3. 2017.
Li, J. et al. Pharmacological activation of AMPK prevents Drp1-mediated mitochondrial fission and alleviates endoplasmic reticulum stress-associated endothelial dysfunction. Journal of Molecular and Cellular Cardiology. 86. 62-74. 2015.
Yu, K.Y. et al. Basic criteria for formation of growth twins in high stacking fault energy metals. Appl. Phys. Lett. 103. 2013.
Bufford, D. et al. Formation Mechanisms of High-density Growth Twins in Aluminum with High Stacking-Fault Energy. Materials Research Letters. 1. 51-60. 2013.
Li, Q. et al. Hierarchical nanotwins in single-crystal-like nickel with high strength and corrosion resistance produced via a hybrid technique. Nanoscale. 12. 1356-1365. 2020.
Dahlgren, S.D. et al. Microstructural analysis and tensile properties of thick copper and nickel sputter deposits. Thin Solid Films. 40. 345-353. 1977.
Wang, J. et al. Double side electroluminescence from p-NiO/n-ZnO nanowire heterojunctions. Appl. Phys. Lett. 95. 2009.
Kini, M. et al. Size dependent strength, slip transfer and slip compatibility in nanotwinned silver. Acta Materialia. 184. 120-131. 2020.
Radetic, T. et al. Mechanism and dynamics of shrinking island grains in mazed bicrystal thin films of Au. Acta Materialia. 60. 7051-7063. 2012.
Sharma, A. et al. Grain growth and solid-state dewetting of Bi-Crystal Ni—Fe thin films on sapphire. Acta Materialia. 168. 237-249. 2019.
Westamcott, K.H. et al. Physical vapour deposition growth and transmission electron microscopy characterization of epitaxial thin metal films on single-crystal Si and Ge substrates. Philosophical Magazine A. 81. 1547-1578. 2001.
Wynblatt, P. et al. Heteroepitaxy of FCC-on-FCC systems of large misfit. Acta Materialia. 225. 2022.
Izadi, E. et al. Grain rotations in ultrafine-grained aluminum films studied using in situ TEM straining with automated crystal orientation mapping. Materials & Design. 113. 186-194. 2017.
Wan, T. et al. Work hardening discrepancy designing to strengthening gradient nanotwinned Cu. Scripta Materialia. 201. 2021.
Han J.H. et al. MEMS-Based Testing Stage to Study Electrical and Mechanical Proprieties of Nanocrystalline Metal Films. MEMS/MOEMS Components and their Applications IV. Proc of SPIE vol. 6464 64640C 2007. doi 1117/12. 706115.

\* cited by examiner

NANOTWINNED NICKEL FILMS WITH HIGH STRENGTH AND DUCTILITY

CROSS-REFERENCE TO RELATED APPLICATIONS

This application claims priority to, and the benefit of, U.S. Provisional Patent Application Ser. No. 63/389,649 filed on Jul. 15, 2022 and entitled "NANOTWINNED NI FILMS WITH HIGH STRENGTH AND DUCTILITY." The disclosure of the foregoing application is incorporated herein by reference in its entirety, including but not limited to those portions that specifically appear hereinafter, but except for any subject matter disclaimers or disavowals, and except to the extent that the incorporated material is inconsistent with the express disclosure herein, in which case the language in this disclosure shall control.

FEDERALLY SPONSORED RESEARCH OR DEVELOPMENT

This invention was made with government support under 1454109 awarded by the National Science Foundation. The government has certain rights in the invention.

TECHNICAL FIELD

The present disclosure relates to forming metal films, and in particular to synthesizing nanotwinned (NT) metal films by sputtering deposition.

BACKGROUND

Conventionally, metallic films are used as interconnects in applications, for example semiconductor devices, flexible electronic devices, and micro-electromechanical systems (MEMS). In these applications, it is often desirable for the metal films to exhibit good mechanical and electrical properties, for example, high strength and low resistivity, to function efficiently in semiconductor applications. Nanocrystalline and nanolaminate films typically exhibit high strength, but their electrical resistivity is also high, and their tensile ductility is low. In contrast, nanotwinned (NT) metals exhibit a superior combination of mechanical properties while retaining high electrical conductivity. Although NT metals possess excellent mechanical properties, not all metals can be readily synthesized with a NT microstructure. These metals may be alloyed with other elements to promote the formation of growth twins. Accordingly, a method of synthesizing NT metal films without being alloyed with other elements is presented. Additionally, NT nickel (Ni) films with high strength and ductility are presented.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the detailed description and claims when considered in connection with following illustrative figures.

DETAILED DESCRIPTION

Figure 1A:
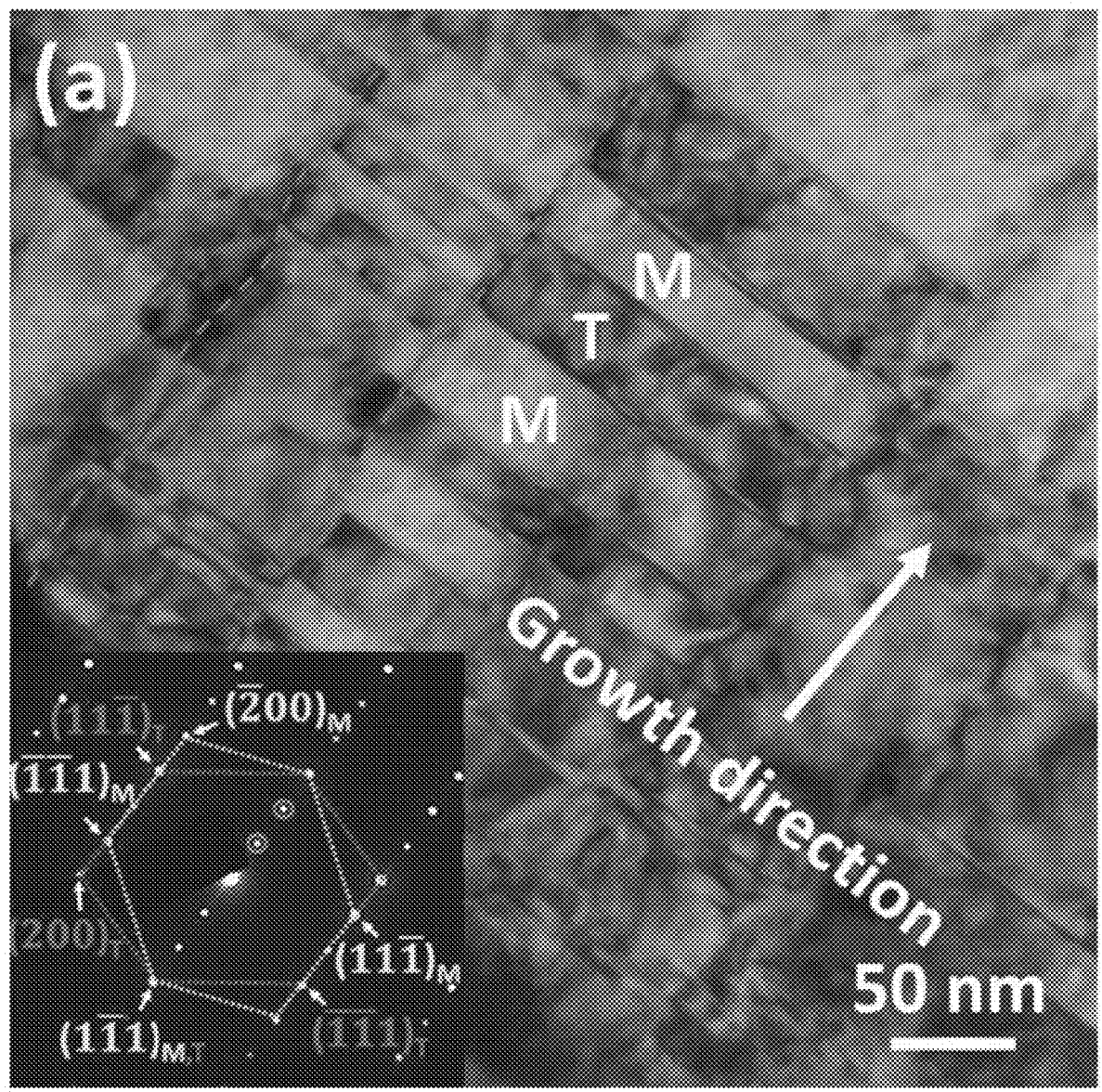
FIG. 1A illustrates a bright field transmission electron microscope (BF-TEM) cross sectional image of a NT Ni film with a thickness of 500 nanometers, wherein the mean twin width is about 20 nanometers, in accordance with various embodiments.

The detailed description of exemplary embodiments herein makes reference to the accompanying drawings, which show exemplary embodiments by way of illustration. While these exemplary embodiments are described in sufficient detail to enable those skilled in the art to practice the principles of the present disclosure, it should be understood that other embodiments may be realized and that logical changes and adaptations in design and construction may be made in accordance with principles of the present disclosure. Thus, the detailed description herein is presented for purposes of illustration only and not of limitation. For example, steps recited in any of the method or process descriptions may be executed in any suitable order and are not necessarily limited to the order presented. Furthermore, any reference to singular includes plural embodiments, and any reference to more than one component or step may include a singular embodiment or step.

For the sake of brevity, conventional techniques for forming metallic films, materials deposition, thermal processing, microstructure creation, crystalline engineering, and/or the like may not be described in detail herein. Furthermore, the connecting lines shown in various figures contained herein are intended to represent exemplary functional relationships and/or physical couplings between various elements. It should be noted that many alternative or additional functional relationships or physical connections may be present in a practical method for forming metallic films, related methods, and/or products arising therefrom.

Nanotwinned (NT) metal films exhibit a low electrical resistivity while maintaining the high strength of nanocrystalline or nanolaminate films, which gives NT metal films properties ideal for use in semiconductor applications. Although NT metals possess excellent mechanical properties for these applications, not all metals can be readily synthesized with a NT microstructure. Specifically, it is difficult for growth twins to form in metals with a high stacking fault energy (SFE) like Ni and Al ($SFE_{Ni}$=128 mJ/m$^2$, $SFE_{Al}$=120-165 mJ/m$^2$). One way to obtain a NT structure is to alloy metals like Ni and Al with other elements to lower the SFE, which will promote the formation of growth twins. Another method is to deposit them on a seed layer of a metal with low SFE such as Copper (Cu) or Silver (Ag), which form growth twins readily during electrodeposition or physical vapor deposition. The twins in the low SFE seed layer can propagate into the high SFE metal layer, resulting in the formation of a high SFE NT metal film. The twin width distribution in the high SFE NT metal film may be tailored by altering the deposition temperature, deposition rate and film thickness to achieve optimal properties for an intended application.

The present disclosure concerns the synthesis of high SFE NT metallic films on a low SFE metal layer using sputter deposition, specifically magnetron sputtering, and altering the mean and distribution of twin widths in the high SFE NT metal films to improve their mechanical properties. In various embodiments, a method for forming a NT metal film may comprise providing a single crystal silicon wafer, etching the single crystal silicon wafer, depositing a silver film onto the single crystal silicon wafer to form a silver buffer layer, and depositing a metallic film onto the silver buffer layer using magnetron sputtering. In various embodiments, silver (Ag) may be used as a buffer layer to form NT Nickel film. In various exemplary embodiments, the method may also include rotating the single crystal silicon wafer and controlling the temperature during the deposition of the metallic film. In various exemplary embodiments, the single crystal silicon wafer may be etched using hydrofluoric acid. In various exemplary embodiments, the silver buffer layer may have a thickness of about 25 nanometers. In various embodiments, the local coherency between the low SFE seed layer and the high SFE metal layer may be utilized to propagate twins into the high SFE metal.

In various embodiments, NT metal films with different mean and distribution of twin widths may be synthesized on single crystal Si wafers. The mean and distribution of twin widths for a NT metal film may be modified by changing the temperature at which the metal is deposited in forming the NT metal film, or the deposition temperature. Moreover, in various embodiments, a higher mean and broader distribution of twin widths leads to better mechanical properties in the NT metal film. For example, increasing the mean and broadening the distribution of twin widths in a NT Ni film increases the tensile ductility. In various embodiments, the properties of a NT Ni film may be improved by varying the deposition temperature of the Ni. In various embodiments, a first NT Ni film may have a mean twin width of about 20 nanometers, or more generally between about 10 nanometers and about 30 nanometers. In various embodiments, a second NT Ni film may have a mean twin width of about 180 nanometers, or more generally between about 120 nanometers and about 240 nanometers. In various embodiments, the first and second NT Ni films may be individually synthesized on silicon wafers with a buffer layer of silver to form a NT metal film, wherein the buffer layer may have a thickness of about 25 nanometers, or more generally between about 10 nanometers and about 50 nanometers. In various embodiments, the buffer layer may comprise copper or another metal with a low SFE.

In the preferred embodiments, the metallic film may be nickel (Ni), forming an NT Ni film. In various other embodiments, the NT metal may be aluminum or another metal with a high stacking fault energy. In various exemplary embodiments, the NT Ni film may have a thickness of about 500 nanometers, or more generally between about 100 nanometers and about 1000 nanometers. In various embodiments, the Ni film is deposited at room temperature. In other various exemplary embodiments, the NT Ni film may have a thickness of approximately between about 1 micrometer and about 10 micrometers, for example 2.2 micrometers. In various embodiments, about the first 100 nanometers of the metallic film (or more generally, between about the first 50 nanometers and about the first 200 nanometers) may be deposited at about 300 degrees Celsius (or more generally, between about 200 degrees Celsius and about 400 degrees Celsius) and the remainder of the metallic film may be deposited at about 80 degrees Celsius (or more generally, between about 60 degrees Celsius and about 100 degrees Celsius). In various embodiments, the Ag film is deposited at about 100 W, 3 mTorr Ar pressure. In various embodiments, the Ag film is deposited while the single crystal Si wafer is rotated. In various embodiments, the single crystal Si wafer is rotated at about 40 RPM (or more generally, between about 20 RPM and about 60 RPM). In various embodiments, the base pressure of a chamber before deposition is less than 5×10$^{-8}$ Torr. In various embodiments, the rate of deposition of Ag is about 12 nanometers per minute (or more generally, between about 4 nanometers per minute and about 20 nanometers per minute). In various embodiments, the rate of metallic film deposition is about 5 nanometers per minute (or more generally, between about 2 nanometers per minute and about 8 nanometers per minute).

In various embodiments, the single crystal Si wafer may have a thickness of about 200 micrometers. In various embodiments, the single crystal silicon wafer may have a Miller index of (111). In various embodiments, the single crystal silicon wafer may be HF-etched with a 25 nanometers silver buffer layer (or more generally, a buffer layer of any suitable thickness, for example between about 10 nanometers and about 50 nanometers) deposited on it using magnetron sputtering. In various exemplary embodiments, the single crystal silicon wafer may have a Miller index of (111).

In various embodiments, the NT Ni film may have a thickness of about 500 nanometers. In various exemplary embodiments the metallic film may be deposited at room temperature. The nanotwinned metal film may have a mean twin width of about 20 nanometers.

In various embodiments, the NT Ni film may have a thickness of about 2.2 micrometers. In various exemplary embodiments, the about first 100 nanometers of the Ni film may be deposited at about 300 degrees Celsius and the rest of the Ni film may be deposited at about 80 degrees Celsius. The NT Ni film may have a mean twin width of about 180 nanometers.

Figure 1B:
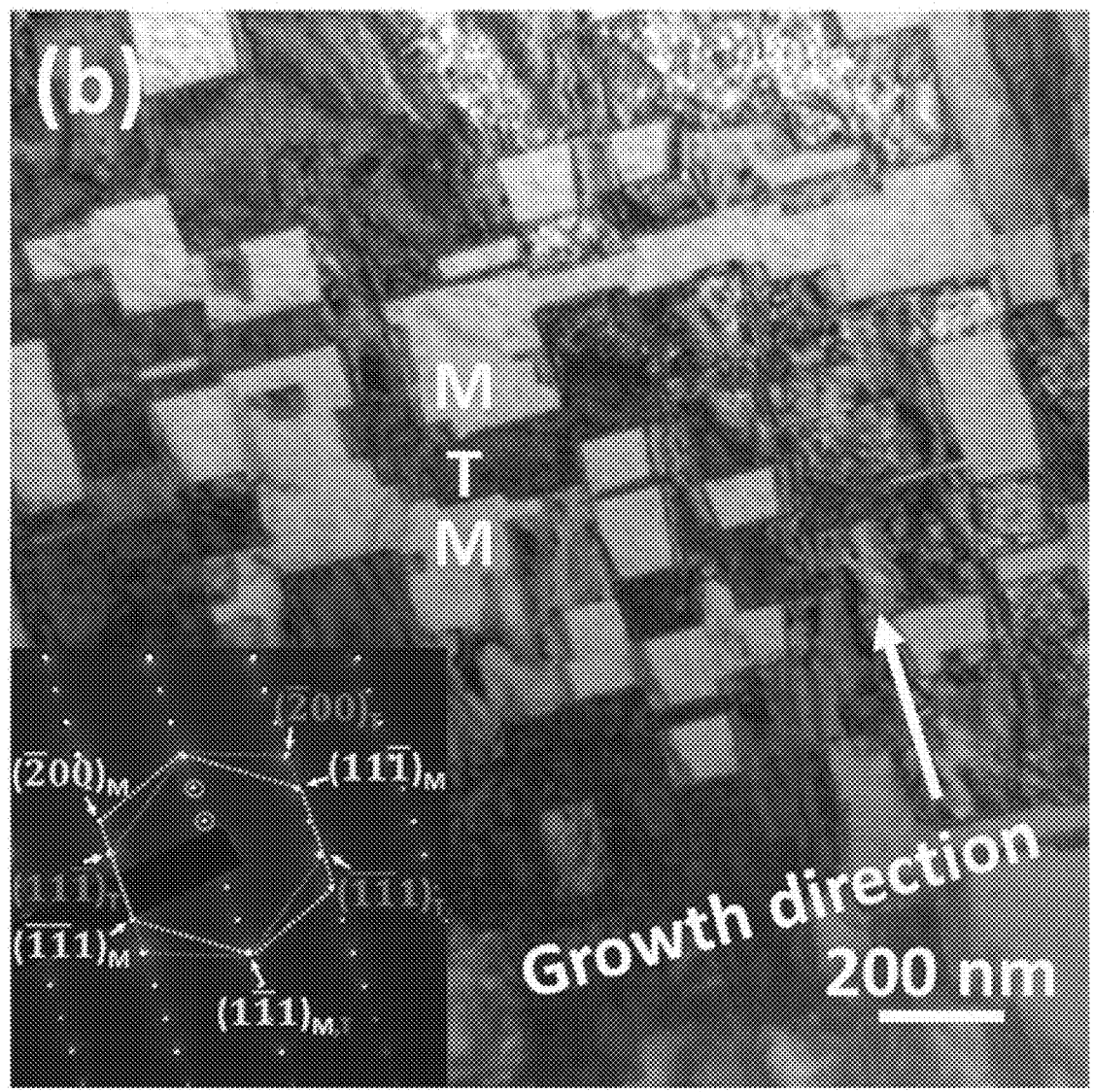
FIG. 1B illustrates a BF-TEM cross-section of a NT Ni film with a thickness of 2.2 and a mean twin width of about 180 nanometers, in accordance with various embodiments.
Figure 2A:
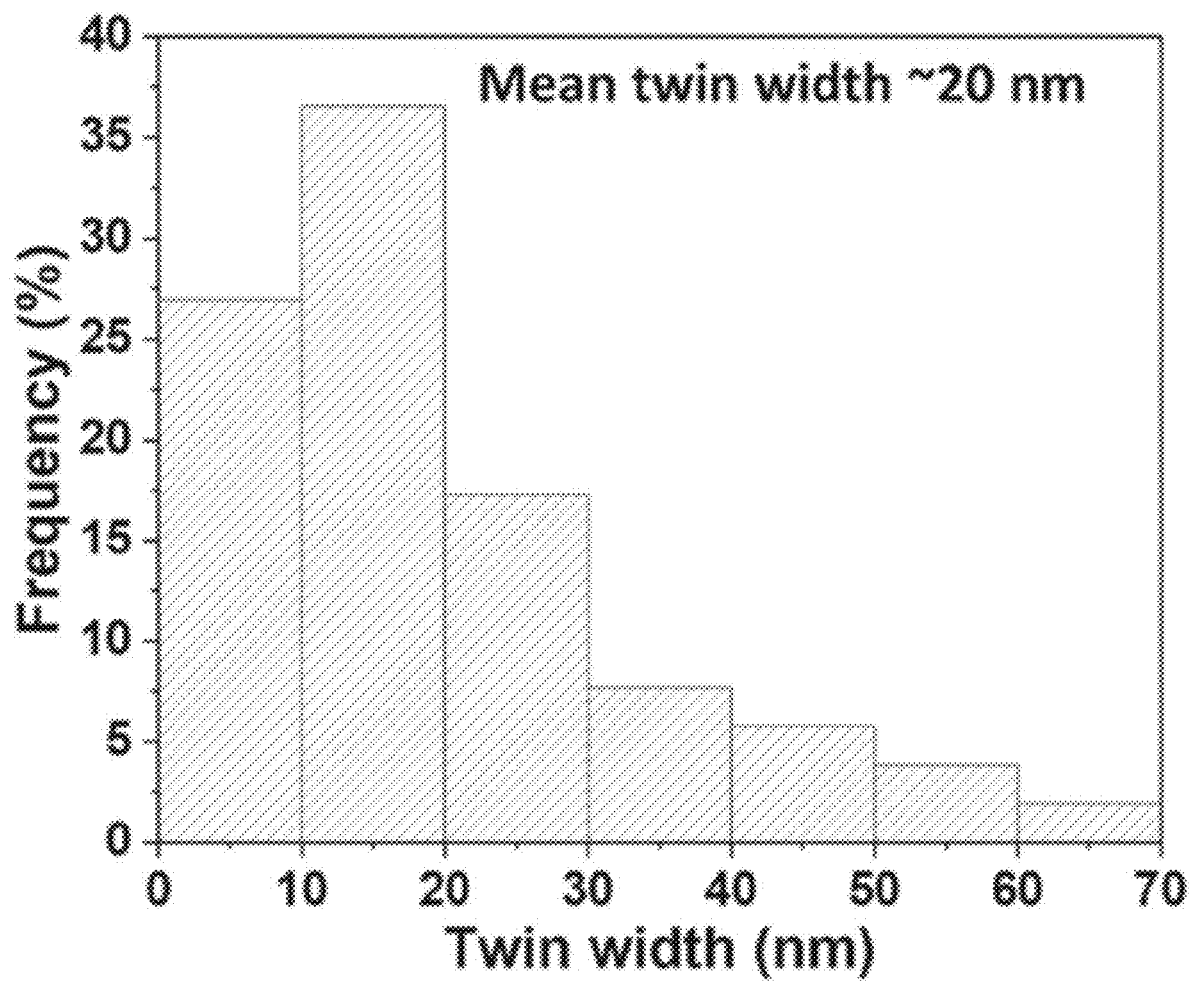
FIG. 2A is a graphical representation of the twin width frequency of a NT Ni film with a thickness of 500 nanometers, wherein the range of twin widths is approximately between 5 and 70 nanometers, in accordance with various embodiments.

Referring now to FIG. 1, FIGS. 1A-1B illustrate the bright field transmission electron microscope (BF-TEM) cross-sectional image of NT Ni films formed in accordance with various exemplary embodiments. FIG. 1A illustrates the BF-TEM cross-sectional image of a 500 nanometer thick NT Ni film with a mean twin width of about 20 nanometers. In various embodiments, the NT Ni film may be deposited at room temperature. The peak of the twin width distribution in the embodiment illustrated in FIG. 1A is between 10 and 20 nanometers, as shown in FIG. 2A. The twins may grow with a columnar structure, wherein the with columnar domain sizes may range from 70 to 170 nanometers. However, a small fraction of the twins may extend across the columnar boundaries. FIG. 1B illustrates the BF-TEM cross-sectional image of a 2.2 micrometer thick NT Ni film with a mean twin width of about 180 nanometers. The NT Ni film may be deposited at an elevated temperature. The film illustrated in FIG. 1B has a mean twin width of about 180 nanometers and width distribution between 25 and about 600 nanometers, and the twins had no indication of columnar growth.

Figure 2B:
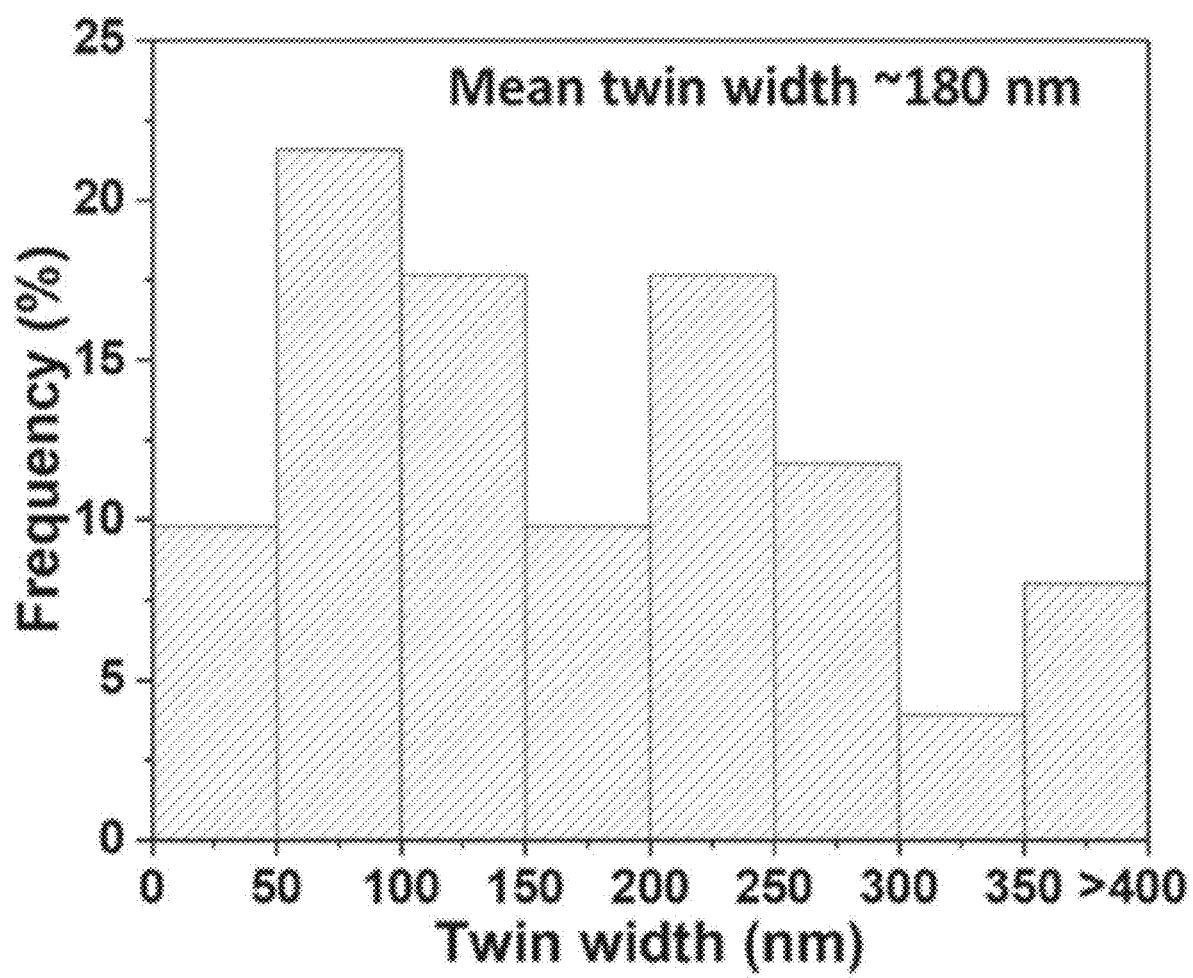
FIG. 2B is a graphical representation of the twin width frequency of a NT Ni film with a thickness of 2.2 µm wherein the range of twin widths is approximately between 25 and 600 nanometers, in accordance with various embodiments.

Referring now to FIG. 2B, the relationship between twin widths and their frequency is illustrated for the film pictured in FIG. 1B, wherein there is a peak in frequency when the twin width is between 50 and 100 nanometers and when the twin width is between 200 and 250 nanometers. In forming the film illustrated in FIG. 1B, the resultant twins may be as large as 600 nanometers in width and as small as 25 nanometers, as graphically represented, resulting in a heterogeneous twin structure. In FIGS. 1A-1B, M 100 refers to the matrix and T 150 refers to the twin, while the red dashed lines indicate columnar boundaries. Further, the insets in both figures show the selected area diffraction (SAD) pattern obtained from a (011) zone axis. Each inset contains two sets of diffraction spots that have mirror symmetry about the direction, which confirms the presence of $\Sigma 3$ {111} coherent twin boundaries (CTBs) perpendicular to the growth direction. The extra spots (circled in green) in the SAD patterns appear at one-third periodicity of Ni {111} planes and emerge from $\Sigma 3$ {112} incoherent twin boundaries (ITBs). Moreover, FIG. 2B illustrates that a higher mean and broader distribution of twin widths leads to improved mechanical properties.

Figure 3:
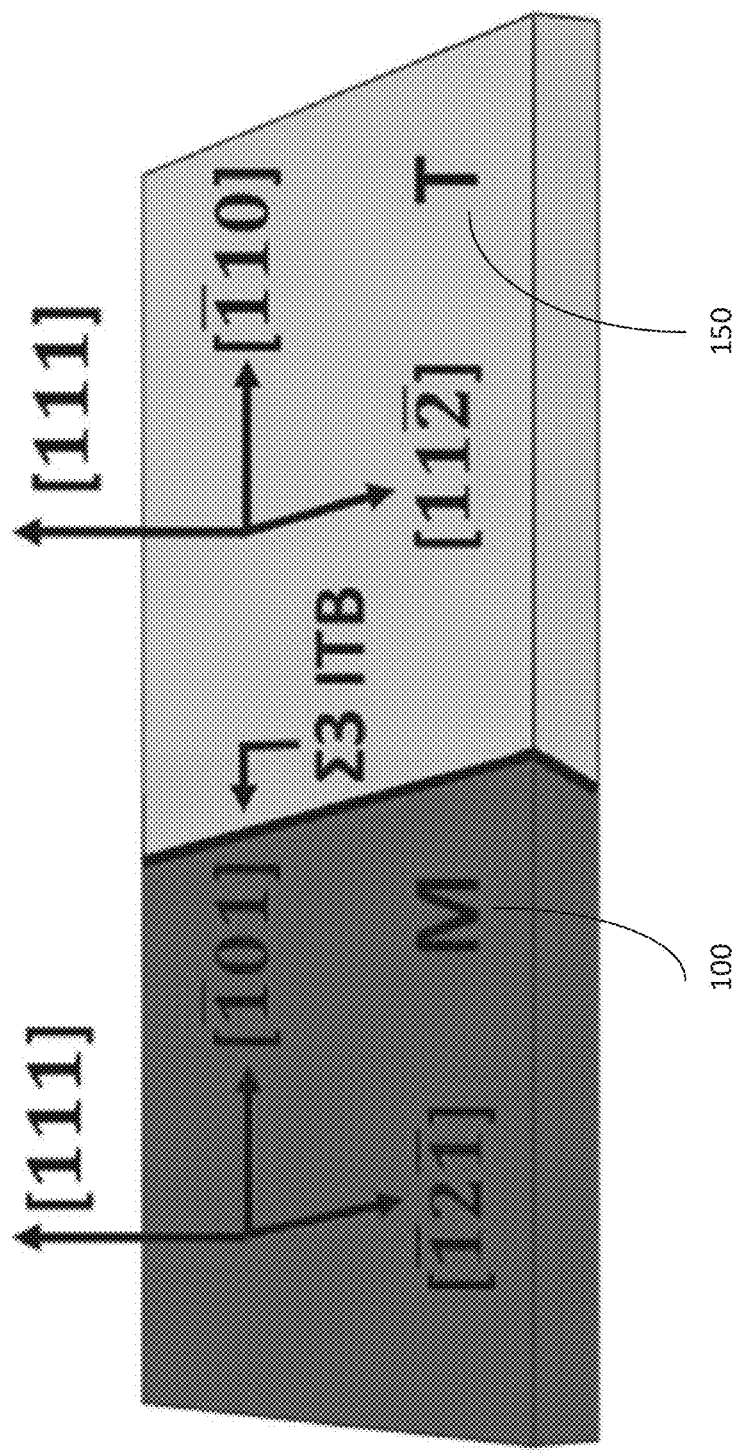
FIG. 3 illustrates Σ3 incoherent twin boundary (ITB) formed between the matrix and the twin when the twinning plane is different from {111} planes and the crystallographic orientation of the matrix and twin, in accordance with various embodiments.

FIG. 3 illustrates a schematic of $\Sigma 3$ incoherent twin boundary (ITB) formed between the matrix and twin when the twinning plane is different from {111} planes. The crystallographic orientation of the matrix and twin are also shown.

Figure 4:
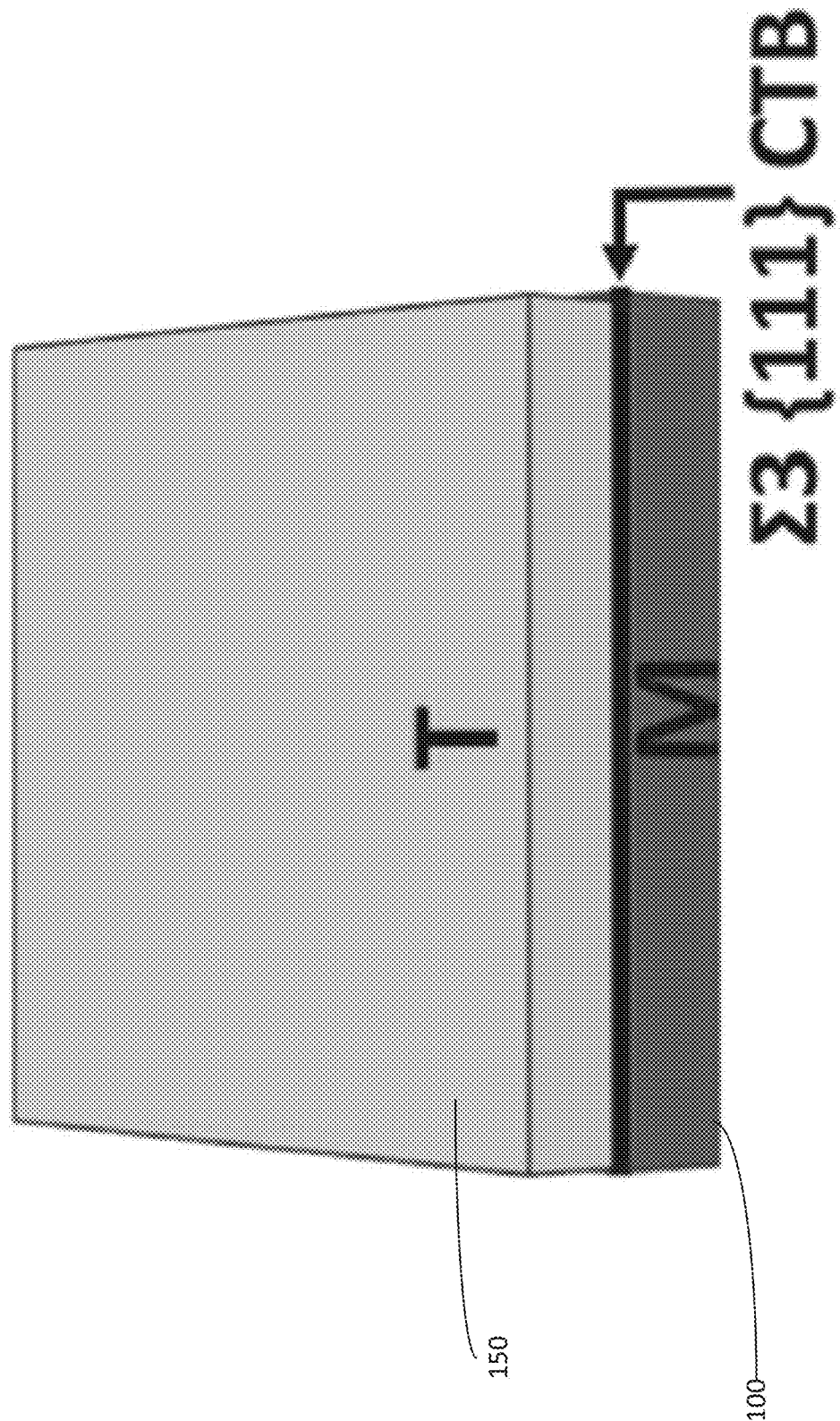
FIG. 4 illustrates the Σ3 {111} coherent twin boundary (CTB) formed between the matrix and twin, in accordance with various embodiments.

FIG. 4 illustrates a schematic of $\Sigma 3$ coherent twin boundary (CTB) formed between the matrix and twin.

Figure 5:
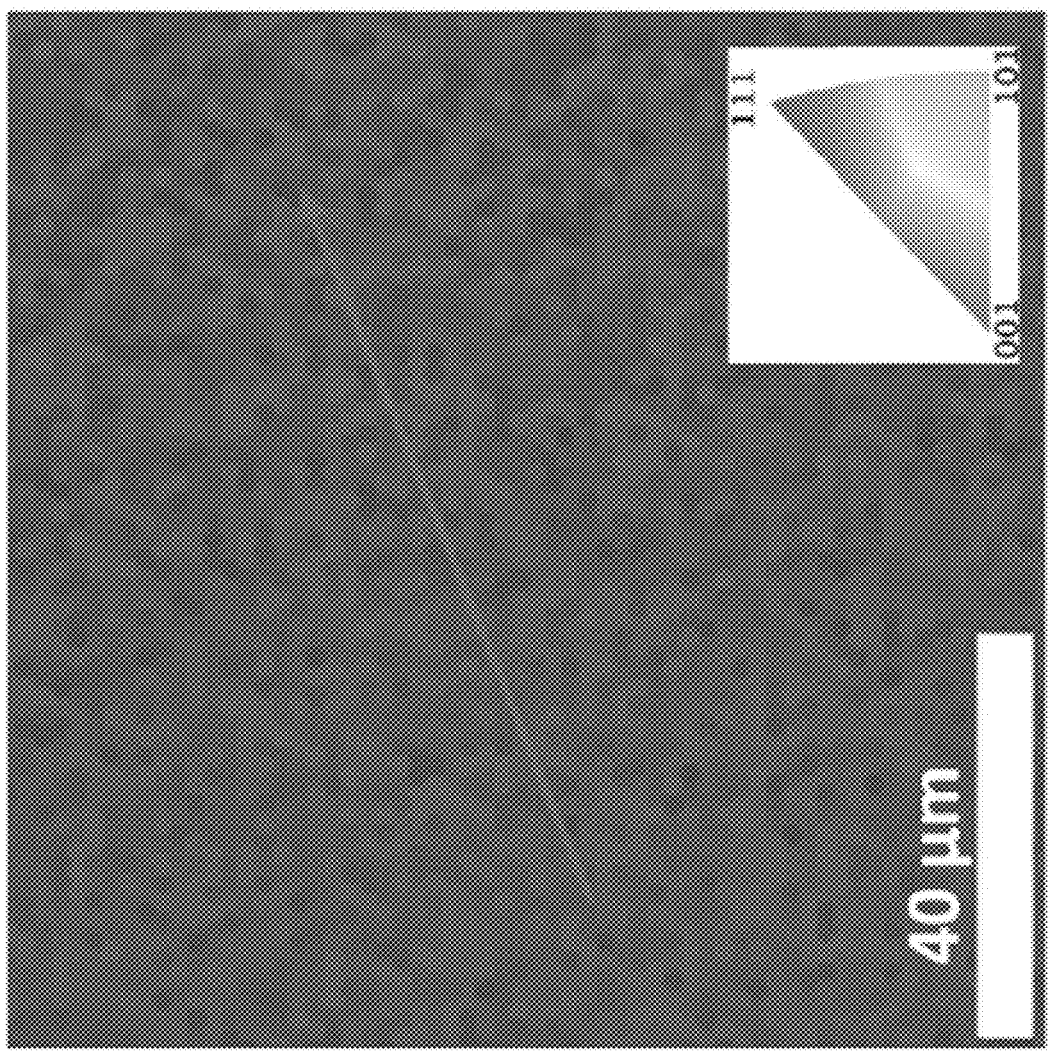
FIG. 5 shows an electron backscatter diffraction (EBSD) map of the out-of-plane orientation of a 500 nanometers thick NT Ni film, in accordance with various embodiments.

Referring now to FIG. 5, an electron backscattered diffraction (EBSD) map of the out-of-plane orientation of a 500 nanometer thick NT Ni film is illustrated. The inset shows the color scheme for the EBSD map. The EBSD map confirms the (111) growth texture of the film.

Figure 6:
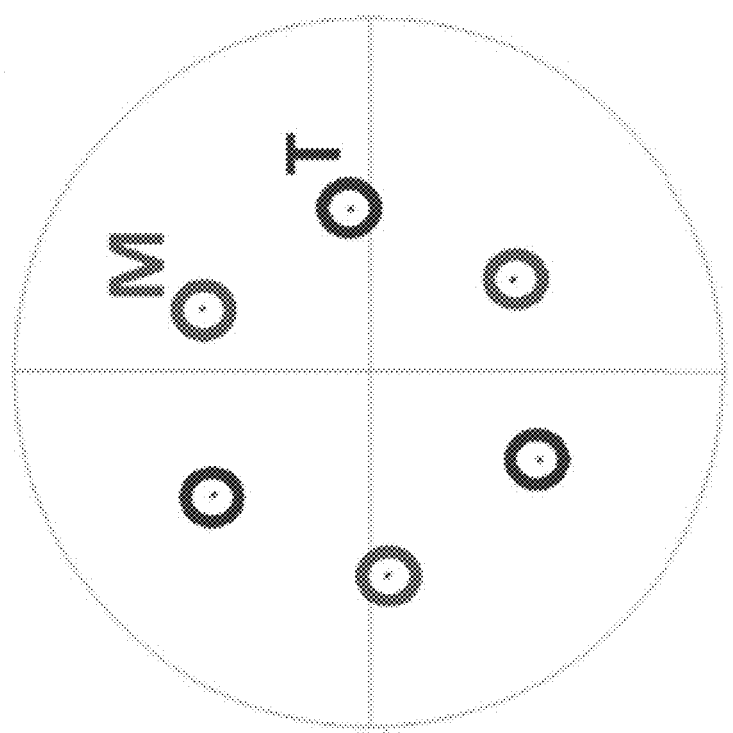
FIG. 6 shows a (100) pole figure showing six (111) poles, wherein three spots correspond to the matrix and the other three spots correspond to the twin, in accordance with various embodiments.

Referring now to FIG. 6, a (100) pole figure of a 500 nanometer thick NT Ni film is shown. The (100) pole figure shows three (111) poles arising from the matrix (M 100), which are rotated by 60 degrees with respect to the three (111) poles originating from the twin variant (T 150).

Figure 7:
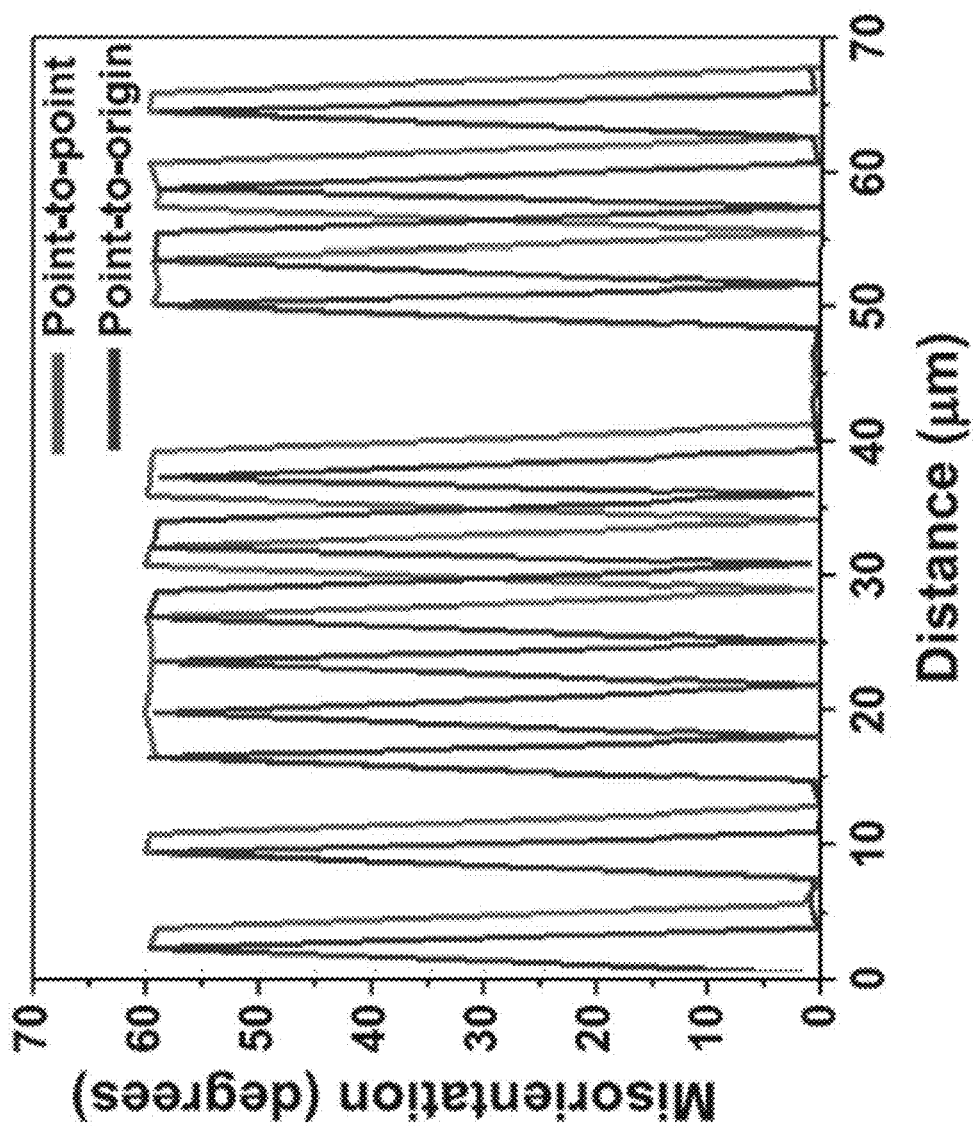
FIG. 7 shows a line profile of crystal misorientation obtained from a NT Ni film, showing the misorientation in degrees as a function of distance, in accordance with various embodiments.

FIG. 7 illustrates a line profile of crystal misorientation across a 500 nanometer thick NT Ni film. The misorientation line profile was obtained from the NT Ni film along the red arrow shown in FIG. 2A. The misorientation line profile confirms the presence of $\Sigma 3$ ITBs with a 60-degree tilt misorientation about the axis. This is consistent with the extra spots (green) seen in the SAD pattern obtained from the NT Ni films (insets in FIGS. 1A and 1B).

Figure 8:
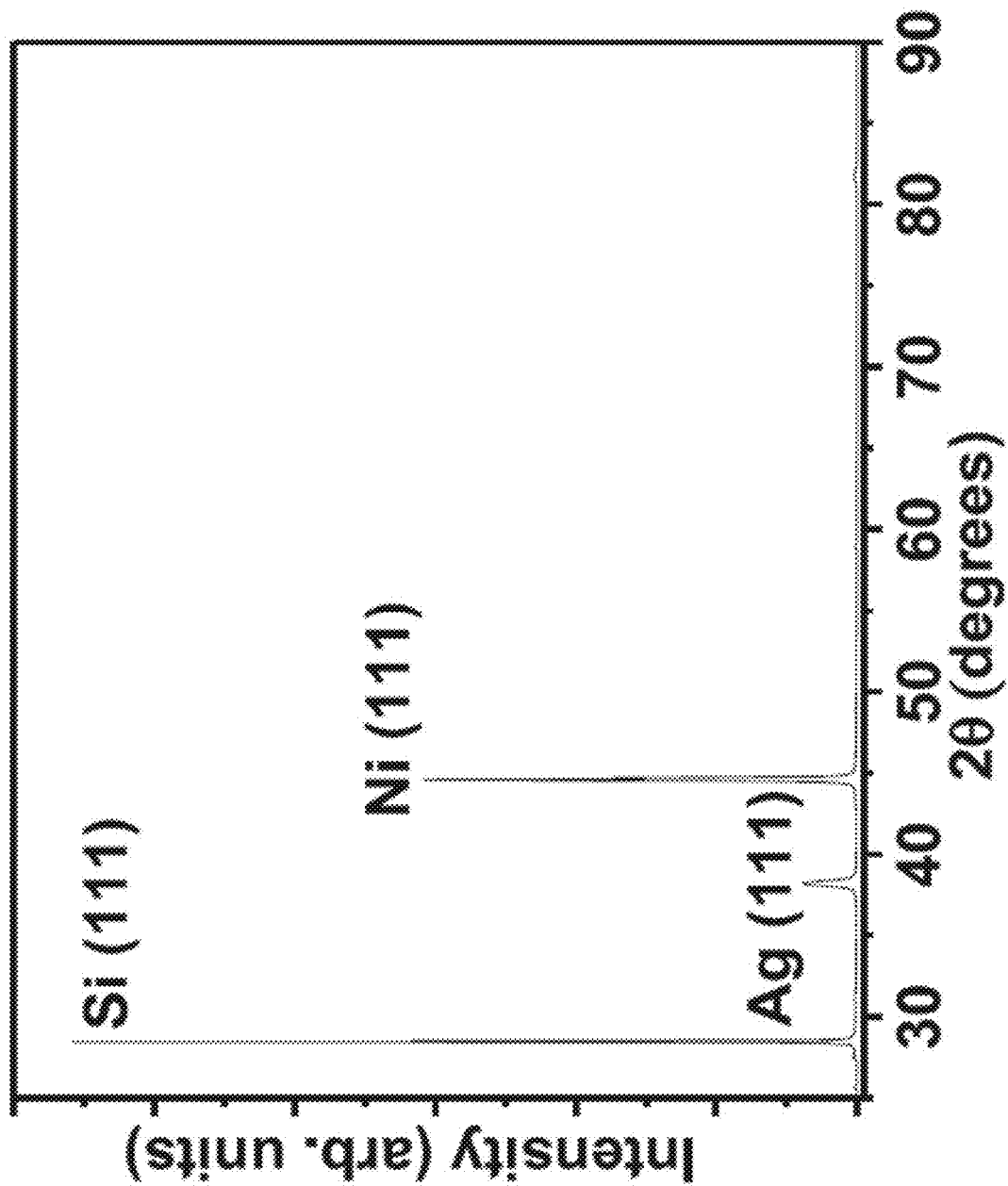
FIG. 8 is a graphical representation of the intensity of the diffracted X-ray beam as a function of the diffraction angle 2θ (degrees) for a nickel/silver (Ni/Ag) film deposited on a hydrofluoric acid (HF) etched silicon (Si) (111) wafer, in accordance with various embodiments.

FIG. 8 illustrates the $\theta$-$2\theta$ X-ray diffraction (XRD) scan of a NT Ni film. In the scan, three distinct peaks appear at 28.46°, 38.21°, and 44.57° from Si (111), Ag (111), and Ni (111), respectively. No other Ag or Ni peaks are observed, which confirms that the films have a (111) texture.

Figure 9:
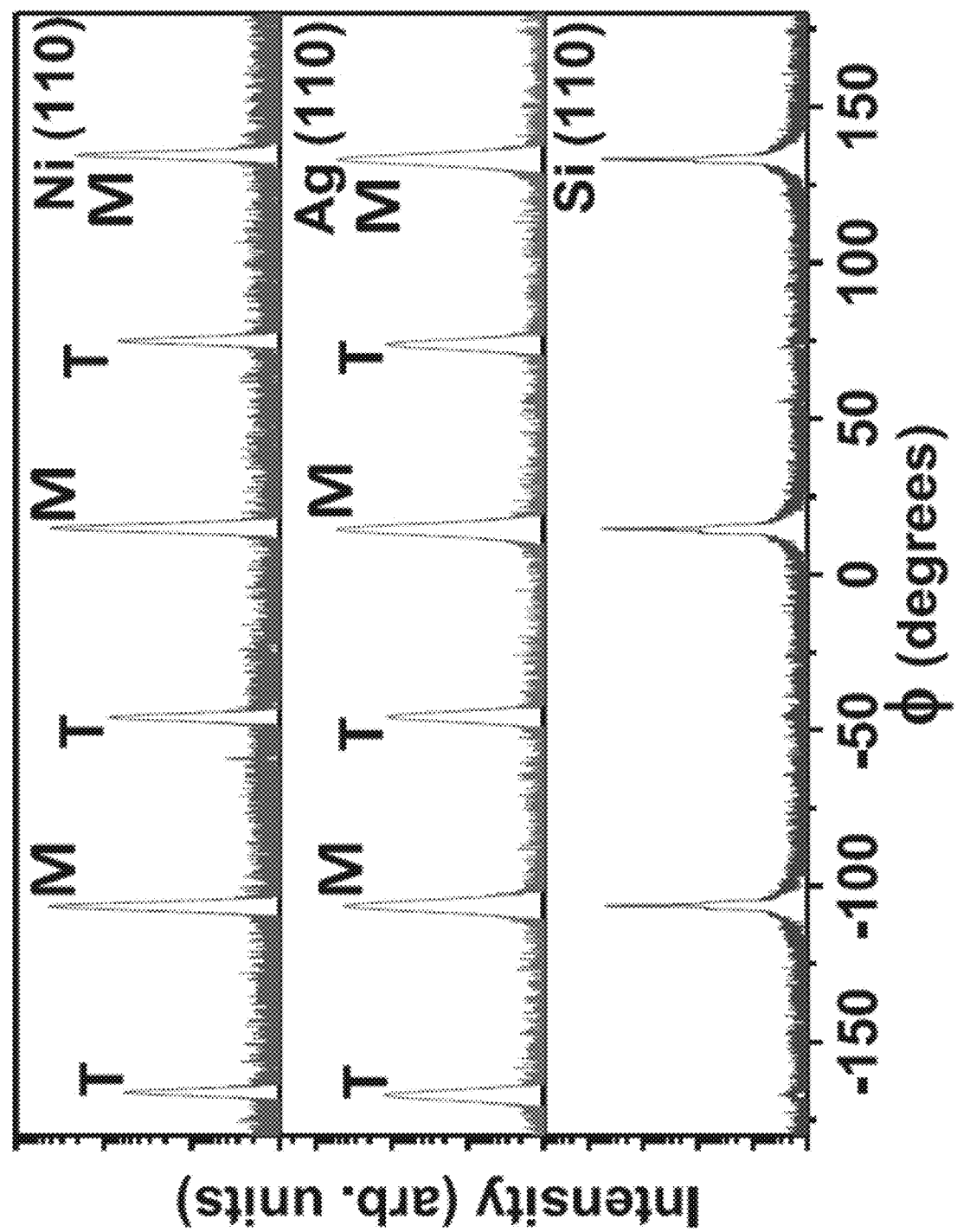
FIG. 9 is a graphical representation of the intensity of the diffracted X-ray beam as a function of rotation angle (I) (degrees) for Si, Ag and Ni for a Ni/Ag film deposited on a HF etched Si (111) wafer, in accordance with various embodiments.

FIG. 9 illustrates the $\phi$ scans of an exemplary NT Ni film. The $\phi$ scans were taken to identify the in-plane crystallite orientation. The $\phi$ scans were performed by rotating the substrate about the axis while the (110) planes reflected. The Si substrate showed three (110) peaks that were separated by 120°, as expected from a single crystal Si (111) wafer. Ag and Ni films revealed two sets of peaks with 3-fold symmetry separated by 60° from each other (labeled M 100 and T 150). The higher intensity peaks (labeled M 100) that aligned well with Si peaks corresponded to the matrix and the three relatively lower intensity peaks (labeled T 150) corresponded to the twin variant. From the TEM, XRD and EBSD characterizations, it may be seen that Ni may grow with a NT structure on Si (111) substrates with an Ag buffer layer.

Figure 10:
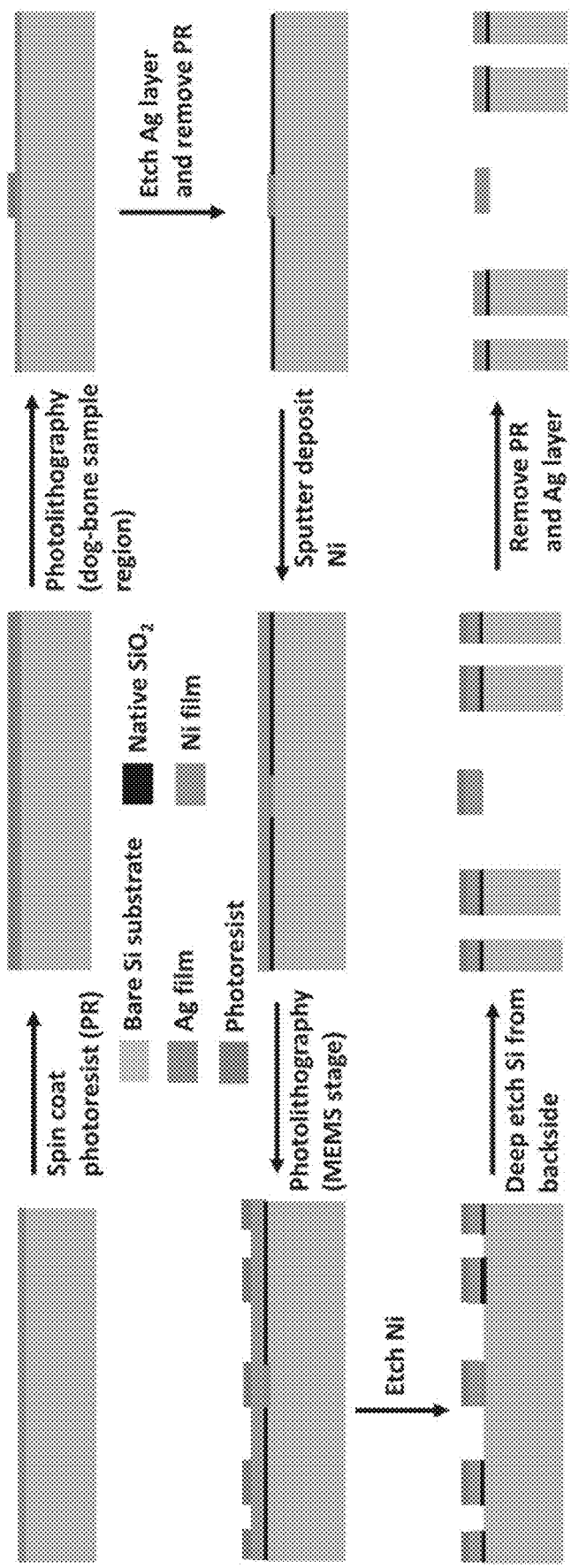
FIGS. 10 and 11 illustrate a fabrication process and an optical image of a MEMS tensile testing stage, in accordance with various exemplary embodiments.
Figure 11:
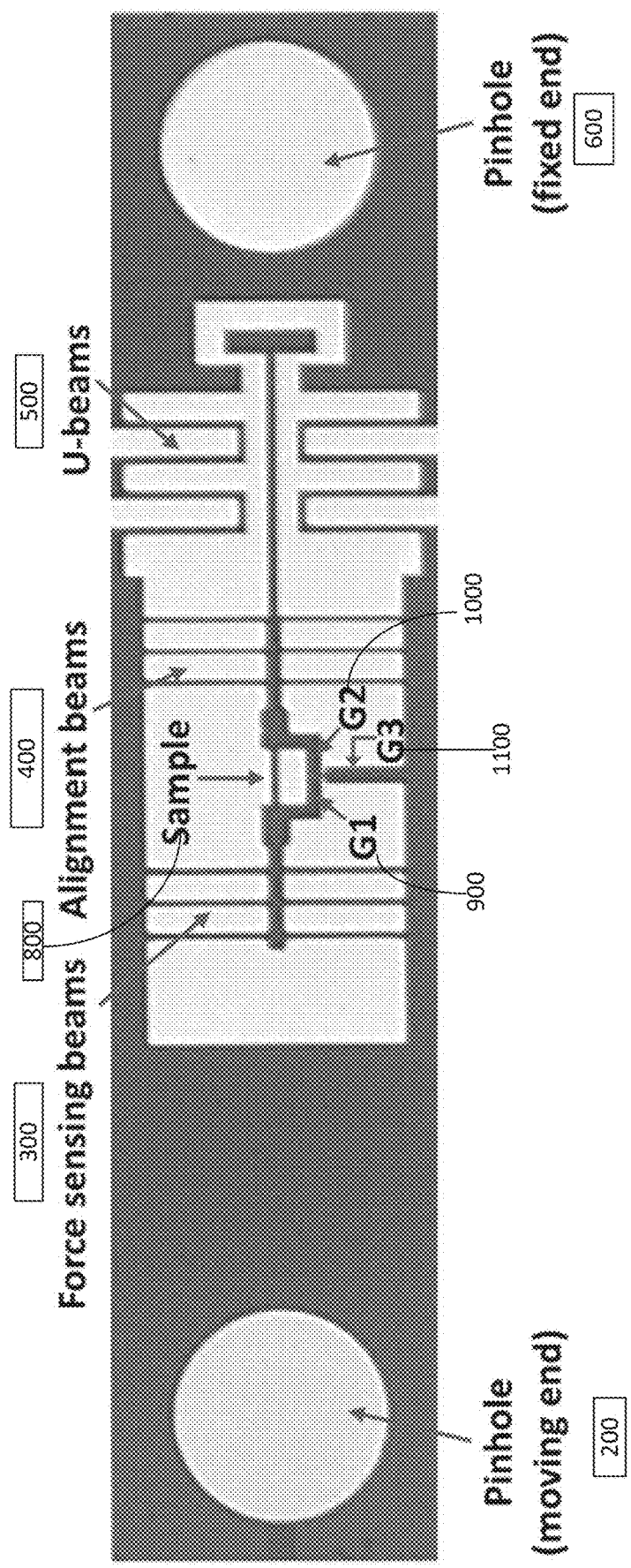

Referring now to FIG. 10, exemplary steps that may be involved in the fabrication of a MEMS stage to perform tensile tests on NT Ni films are shown, according to various embodiments. To perform tensile testing of exemplary NT Ni films, freestanding, dog bone-shaped samples were co-fabricated with MEMS tensile testing stages using microfabrication processes. After microfabrication, the freestanding nanotwinned nickel film samples (about 375 micrometers long and about 80 micrometers wide) may be uniaxially deformed at a quasi-static strain rate of about $10^{-5}$/s using the MEMS tensile testing stage illustrated in FIG. 11. The gauges (G1 900, G2 1000, and G3 1100) help to obtain the stress and strain on the sample. During the experiments, the stage is pulled from one end at a specific displacement rate using a piezo actuator, while keeping the other end fixed. The MEMS tensile testing apparatus illustrated in FIG. 11 further comprises a pinhole (moving end) 200, a pinhole (fixed end) 600, a plurality of force sensing beams 300, a plurality of alignment beams 400, and a plurality of U-beams 500, and a sample of the NT Ni film 800. The sample of the NT Ni film 800 is surrounded by gauges G1 900, G2 1000, and G3 1100. Further, a series of images of the gauges may be captured as the sample is deformed and may be later analyzed.

Figure 12A:
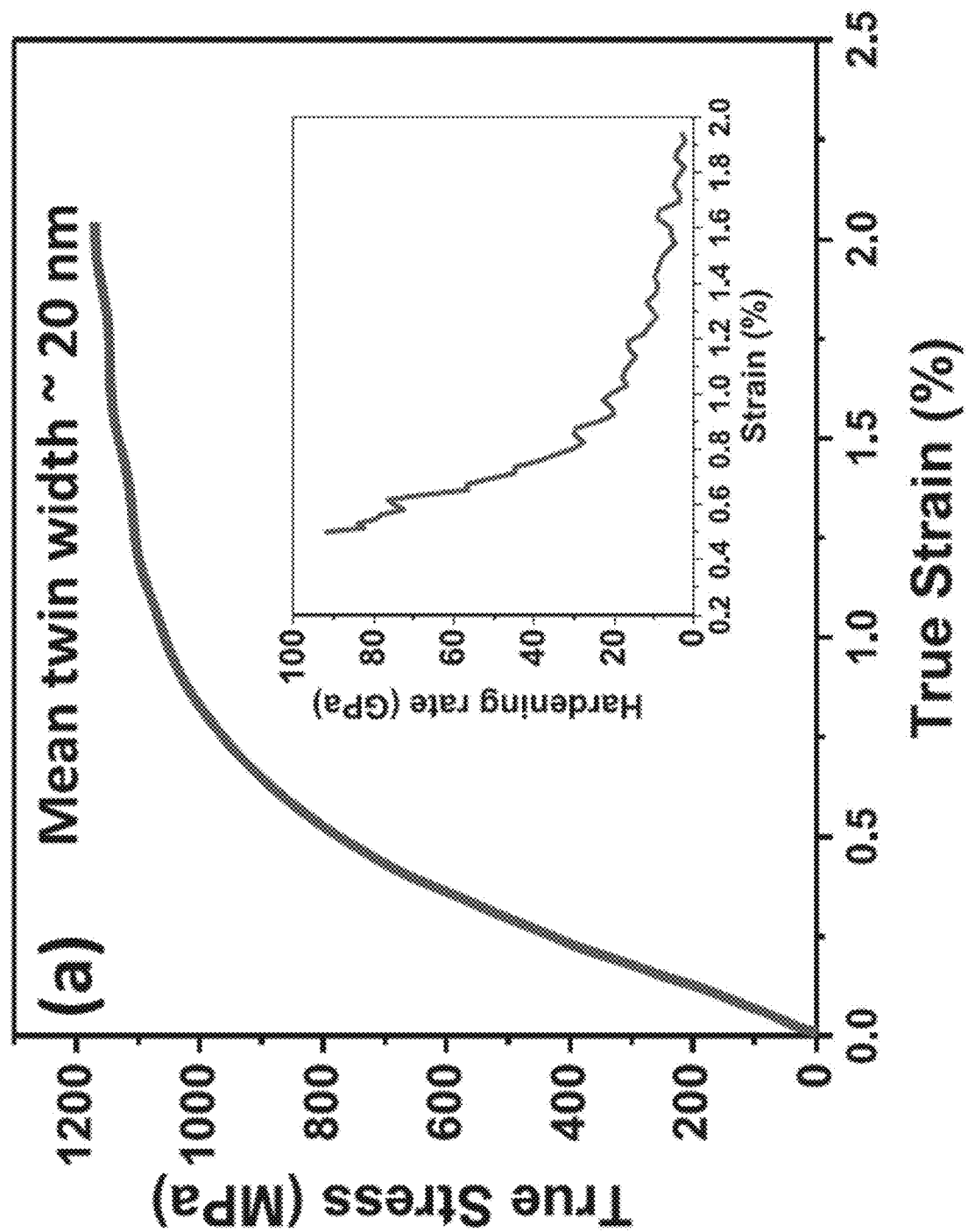
FIGS. 12A and 12B illustrate true stress-true strain curves of NT nickel films created in accordance with various exemplary embodiments.
Figure 12B:
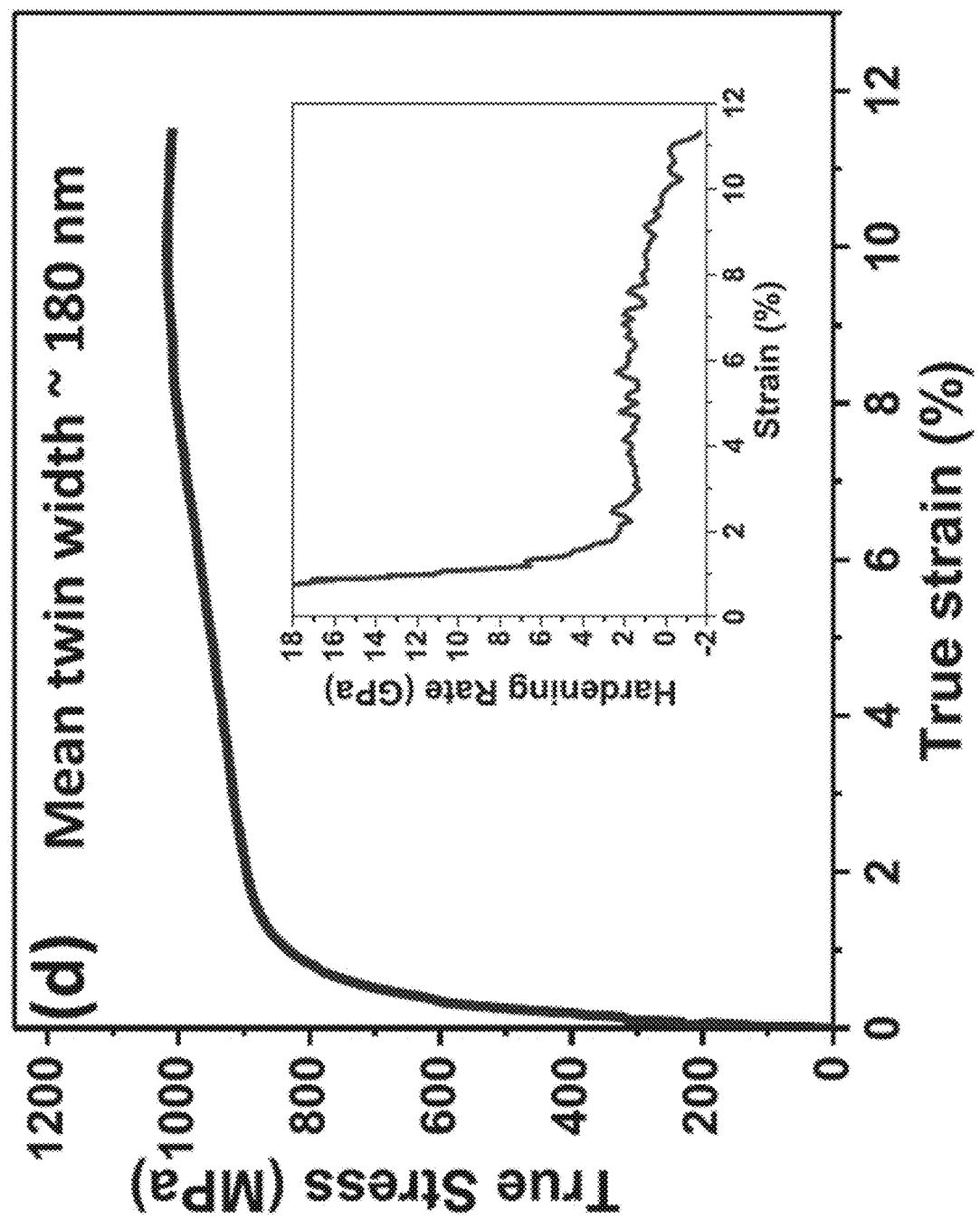
Figure 13A:
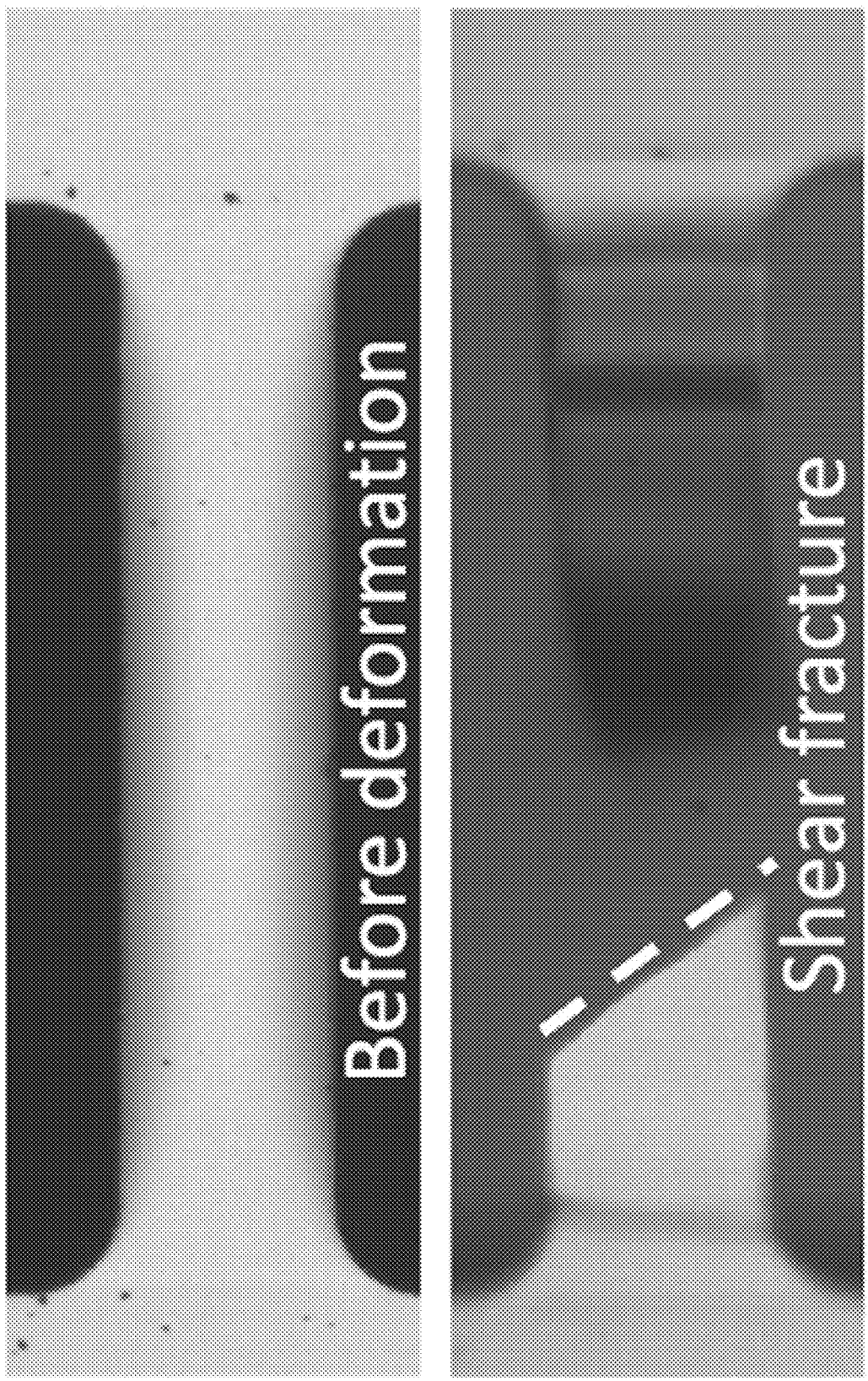
FIGS. 13A and 13B illustrate optical images of NT nickel films created in accordance with various exemplary embodiments before deformation and after failure, in accordance with various embodiments.

Referring now to FIGS. 12A and 12B, the true stress-true strain curves of representative samples from NT Ni films created are shown in accordance with various exemplary embodiments. FIG. 12A shows the true stress-true strain curve of a freestanding, NT Ni film sample with a thickness of 500 nanometers which had a mean twin width of 20 nanometers and narrow distribution of twin widths (FIG. 2A). FIG. 12B shows the true stress-true strain curve of a freestanding, NT Ni film sample with a thickness of 2.2 micrometers which had a mean twin width of 180 nanometers and a broad distribution of twin widths (FIG. 2B). The insets show the hardening rate as a function of strain. Referring now again to FIG. 12A, during the initial elastic deformation, the Young's modulus for the 500 nanometer thick NT Ni film was around 200 GPa. The film yielded around 920 MPa and showed an ultimate tensile strength of 1145 MPa. As shown in the inset, the strain hardening rate of the film monotonically decreases with strain until failure ($\varepsilon$=2.2%), which occurred via shear fracture, as shown in FIG. 13A. Referring now to FIG. 12B, during the initial elastic deformation, the Young's modulus for the 2.2 micrometer thick NT Ni film was also around 200 GPa. FIG. 12B, with FIG. 2B, further shows that the material properties of NT Ni films improve with the increase of mean and a broader distribution of twin widths caused by temperature changes during Ni deposition, specifically tensile ductility. The 2.2 micrometer thick NT Ni film showed a yield stress of 718 MPa and deformed uniformly up to about 10% strain and exhibited an ultimate tensile strength of about 1020 MPa. After an initial steep reduction, the strain hardening rate remained nearly constant at about 1.5 GPa from a strain of 2% to a strain of 7%. Then, the strain hardening rate gradually reduced and the sample started to neck at around a strain of 10%, which was followed by sample failure at a strain of 12%. Notably, a clear neck was observed along the sample width, which is unusual for thin film samples with such a large width (80 micrometers) to thickness (2.2 micrometers) ratio.

Figure 13B:
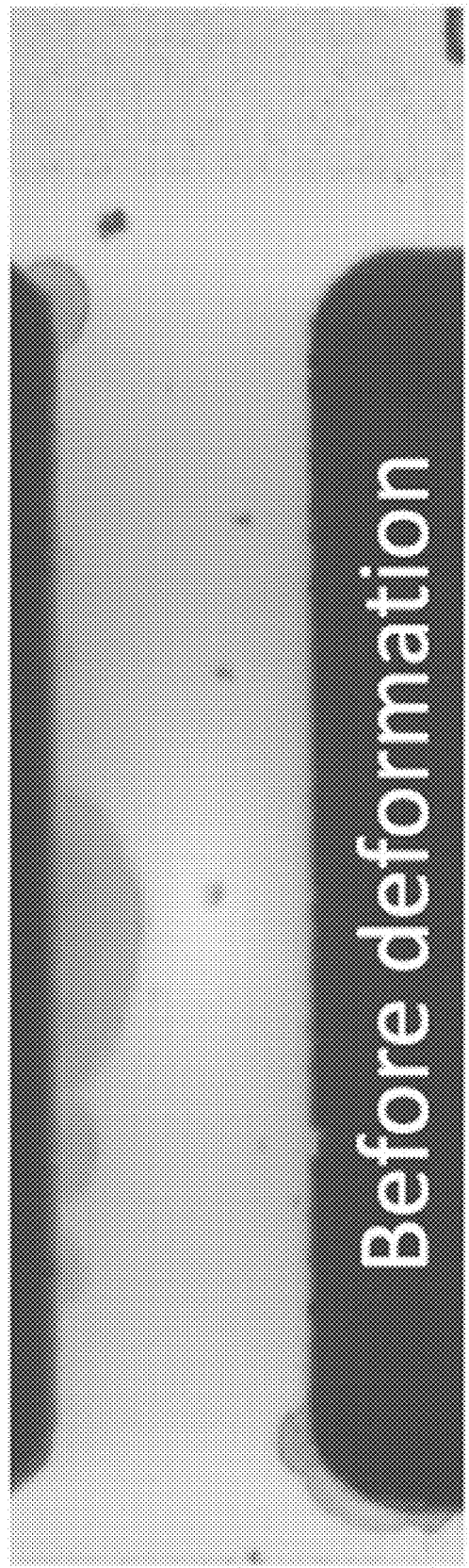
Figure 13B:
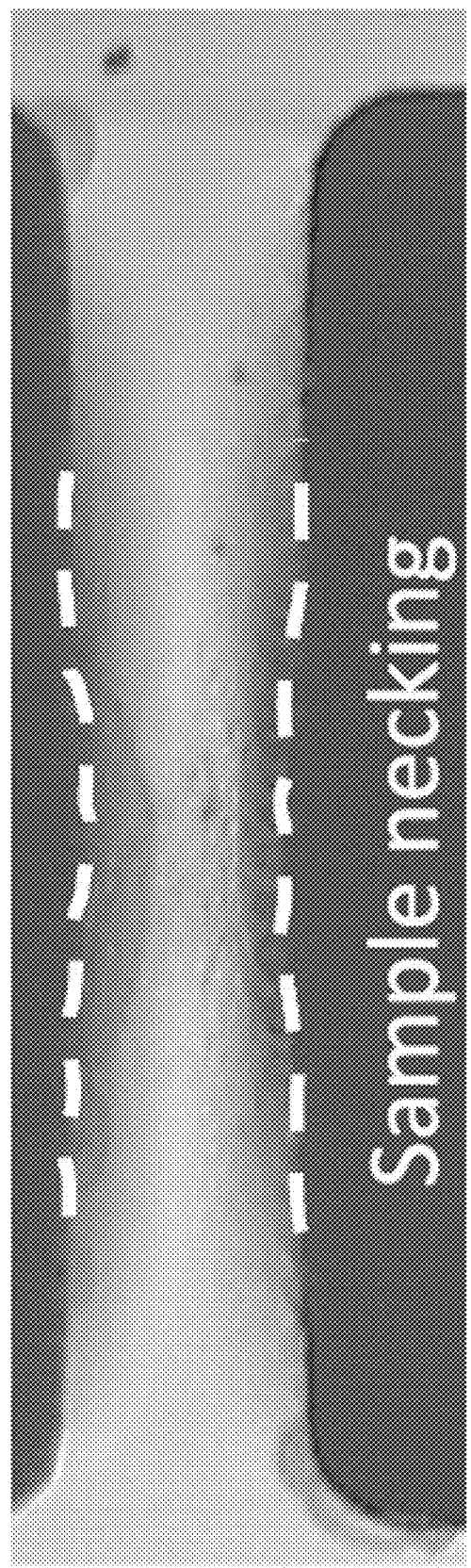

Referring now to FIG. 13A, illustrated is (i) an optical image of the 500 nanometer thick NT Ni film before deformation and (ii) an optical image of the same film after failure. The left edges of the sample are aligned to help visualize the deformation more easily. Referring now to FIG. 13B, illustrated is (i) an optical image of the 2.2 micrometer thick NT Ni film before deformation and (ii) an optical image of the same film after deformation to about 11% strain. The edges of the deformed sample are outlined by white dashed lines to show the necking more clearly.

Figure 14:
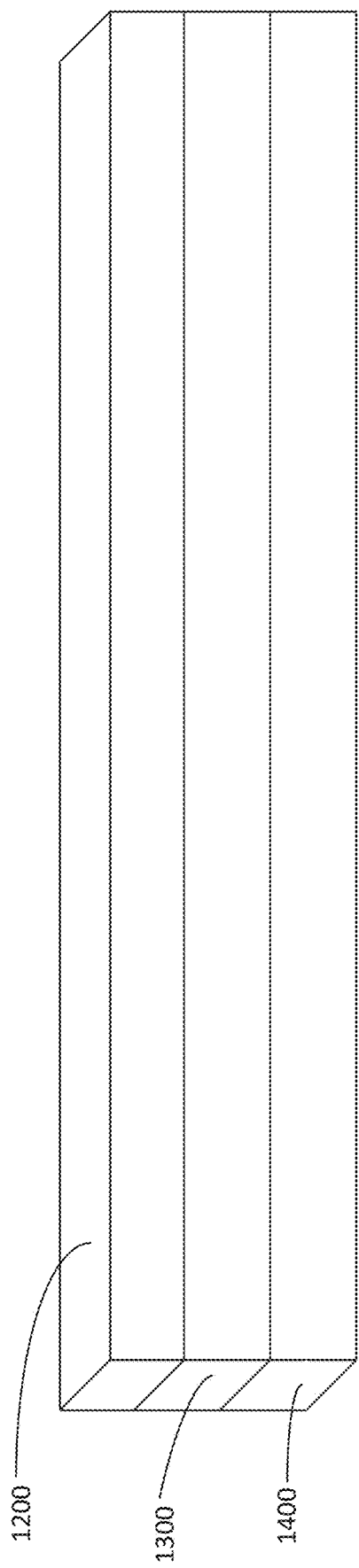
FIG. 14 illustrates a NT nickel film comprising silver and nickel layers on a silicon wafer, in accordance with various embodiments.

FIG. 14 illustrates a simple NT metal film, wherein a first layer may be a single crystal silicon wafer 1400, a second layer may be a silver buffer layer 1300, and a third layer may be a metallic film 1200. The metallic film 1200 may be nickel.

Figure 15:
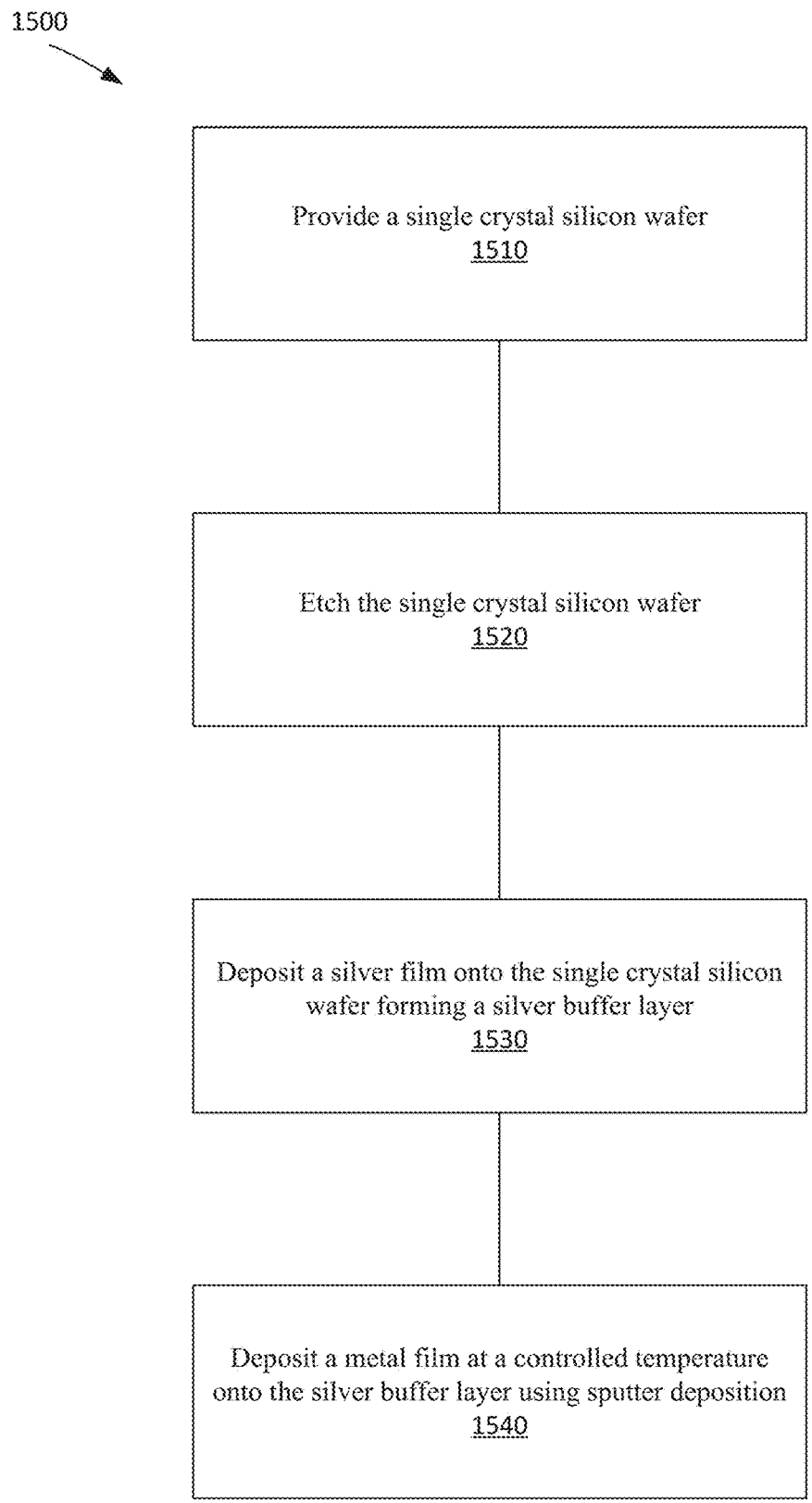
FIG. 15 shows a flowchart of a method of synthesizing NT nickel film, in accordance with various embodiments.

In various embodiments, see FIG. 15, an exemplary method 1500 of forming a NT Ni film may comprise taking a single crystal silicon wafer (step 1510) and etching the single crystal silicon wafer (step 1520), then depositing a silver film onto the single crystal silicon wafer to form a silver buffer layer (step 1530). Then, a Ni film may be deposited onto the silver buffer layer using sputter deposition (step 1540). In various embodiments, the Ni film may be deposited at room temperature. In other embodiments, the first 100 nanometers of the Ni film (or between 50 and 200 nanometers) may be deposited at about 300 degrees Celsius (or between 200 and 400 degrees Celsius), and the remaining Ni film may be deposited at about 80 degrees Celsius (or between 60 and 100 degrees Celsius). In various embodiments, the modulation of the deposition temperature may alter the distribution of twin widths. In various embodiments, a specific deposition temperature may be used to control the mechanical properties of the NT Ni film. In various embodiments, the crystal silicon wafer may be rotated as the Ni film is deposited. In various embodiments, the Ni film may have a width of 2.2 μm (or between about 1 μm and about 10 μm). In various other embodiments, the Ni film may have a width of about 500 nanometers (or between about 100 and 1000 nanometers). In various embodiments, the silver buffer layer may be about 25 nanometers thick (or between about 10 and 50 nanometers thick). In various embodiments, the sputter deposition used in forming the NT Ni film may be magnetron sputtering. In various embodiments, the single crystal silicon wafer may be etched using hydrofluoric acid.

Figure 16:
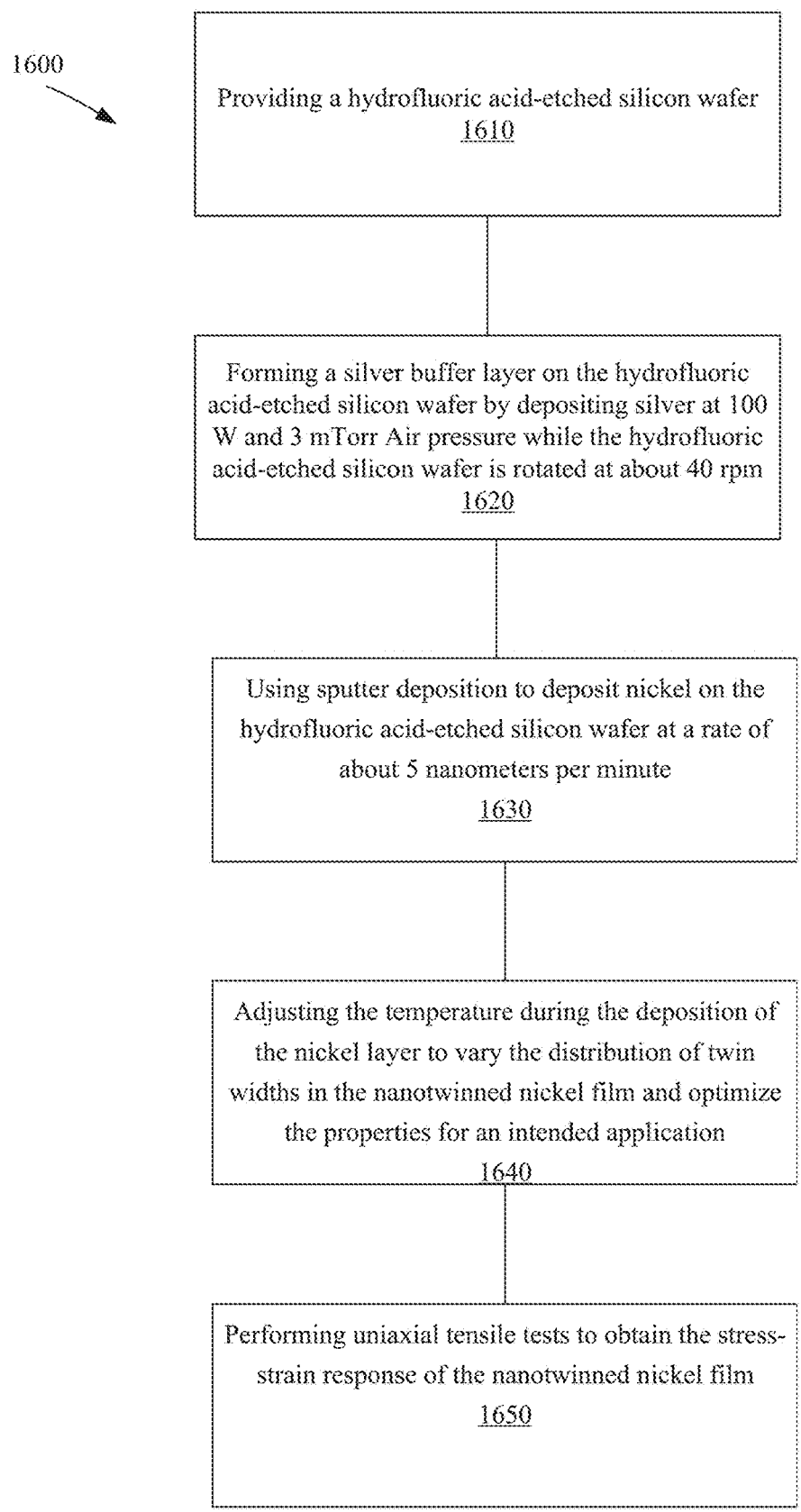
FIG. 16 shows a flowchart of a method of synthesizing a NT nickel film to optimize the properties of the NT nickel film for an intended application, in accordance with various embodiments.

In further embodiments, see FIG. 16, according to a method 1600, on a provided etched silicon wafer (step 1610) the metallic film and the silver are deposited at about 100 W and 3 mTorr Ar pressure while the silicon wafer rotated at about 40 rotations per minute (RPM). In various embodiments, the base pressure before depositions may be about $5\times10^{-8}$ Torr. In various embodiments, the silver may be deposited at about 12 nanometers per minute (or between about 4 and 20 nanometers per minute) (step 1620). In various embodiments, the nickel may be deposited at about 5 nanometers per minute (or between about 2 and 8 nanometers per minute) (step 1630). The temperature may be adjusted appropriately during the deposition of the nickel layer to vary the distribution of twin widths in the NT Ni film for achieving optimal properties of strength and ductility based on a user's intended application (step 1640). In various embodiments, after the nickel is deposited and the NT Ni film is synthesized, it may be deformed under uniaxial tension to obtain the stress-strain response and verify its strength and ductility (step 1650).

While the principles of this disclosure have been shown in various exemplary embodiments, many modifications of structure, arrangements, proportions, the elements, materials and components, used in practice, which are particularly adapted for a specific environment and operating requirements, may be used without departing from the principles and scope of this disclosure. These and other changes or modifications are intended to be included within the scope of the present disclosure and may be expressed in the following claims.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of any embodiment. In the claims, reference to an element in the singular is not intended to mean "one and only one" unless explicitly so stated, but rather "one or more."

Moreover, when language similar to "at least one of A, B, or C" or "at least one of A, B, and C" is used in the claims, the phrase is intended to mean any of the following: (1) at least one of A; (2) at least one of B; (3) at least one of C; (4) at least one of A and at least one of B; (5) at least one of B and at least one of C; (6) at least one of A and at least one of C; or (7) at least one of A, at least one of B, and at least one of C. The word "exemplary" is used herein to mean "serving as an example, instance or illustration". Any embodiment described as "exemplary" is not necessarily to be construed as preferred or advantageous over other embodiments and/or to exclude the incorporation of features from other embodiments.

Systems, methods and apparatus are provided herein. In the detailed description herein, references to "various exemplary embodiments", "one embodiment", "an embodiment", "an exemplary embodiment", etc. indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f), unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of forming a nanotwinned metal film, comprising:
    providing a single crystal silicon wafer;
    etching the single crystal silicon wafer;
    depositing a silver film onto the single crystal silicon wafer forming a silver buffer layer; and
    depositing a metallic film onto the silver buffer layer using sputter deposition, wherein the metallic film comprises nickel, and wherein a first 100 nanometers of the metallic film is deposited at 300 degrees Celsius and a remainder of the metallic film is deposited at 80 degrees Celsius.

2. The method of claim 1, wherein the sputter deposition is magnetron sputtering, and wherein the single crystal silicon wafer is etched using hydrofluoric acid.

3. The method of claim 1, wherein the silver buffer layer has a thickness of about 25 nanometers.

4. The method of claim 1, wherein the metallic film has a thickness of about 500 nanometers.

5. The method of claim 1, wherein the metallic film has a thickness of about 2.2 micrometers.

6. The method of claim 1, wherein the single crystal silicon wafer has a thickness of about 200 micrometers.

7. The method of claim 1, wherein the single crystal silicon wafer has a Miller index of (111).

8. The method of claim 1, further comprising rotating the single crystal silicon wafer during the depositing of the metallic film.

9. A method of synthesizing a nanotwinned nickel film, the method comprising:
    providing a hydrofluoric acid-etched single crystal silicon wafer;
    forming a silver buffer layer on the hydrofluoric acid-etched single crystal silicon wafer by depositing silver at 100 W and 3 mTorr Ar pressure while the hydrofluoric acid-etched single crystal silicon wafer is rotated at about 40 rpm;
    using sputter deposition to deposit a nickel layer on the hydrofluoric acid-etched single crystal silicon wafer at a temperature and at a rate of about 5 nanometers per minute to form the nanotwinned nickel film;
    adjusting the temperature while depositing the nickel layer to vary the distribution of twin widths in the nanotwinned nickel film; and
    performing uniaxial tensile tests to obtain a stress-strain response of the nanotwinned nickel film.

* * * * *